United States Patent
Manipatruni et al.

(10) Patent No.: US 9,305,629 B2
(45) Date of Patent: Apr. 5, 2016

(54) INTEGRATED CAPACITOR BASED POWER DISTRIBUTION

(71) Applicant: Intel Corporation, Santa Clara, CA (US)

(72) Inventors: Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 13/976,053

(22) PCT Filed: Mar. 15, 2013

(86) PCT No.: PCT/US2013/032369
§ 371 (c)(1),
(2) Date: Jun. 26, 2013

(87) PCT Pub. No.: WO2014/143016
PCT Pub. Date: Sep. 18, 2014

(65) Prior Publication Data
US 2014/0269034 A1 Sep. 18, 2014

(51) Int. Cl.
*G11C 11/16* (2006.01)
*G11C 5/14* (2006.01)

(52) U.S. Cl.
CPC .............. *G11C 11/1697* (2013.01); *G11C 5/14* (2013.01); *G11C 11/16* (2013.01)

(58) Field of Classification Search
CPC .......... G11C 11/16; G11C 5/14; H01L 29/86; G05F 1/465
USPC .......................... 365/158, 189.09; 363/60, 89
See application file for complete search history.

(56) References Cited

U.S. PATENT DOCUMENTS

| | | | |
|---|---|---|---|
| 7,013,436 B1 | 3/2006 | Morton et al. | |
| 7,042,783 B2 * | 5/2006 | Hilton | 365/209 |
| 7,596,014 B2 * | 9/2009 | Kawahara et al. | 365/158 |
| 2004/0264223 A1 * | 12/2004 | Pihlstrom et al. | 363/89 |

(Continued)

OTHER PUBLICATIONS

Singer, Pete, "IEDM: Nanoelectronics provide a path beyond CMOS" Solid State Technology, Dec. 11, 2012, 13 pages.

(Continued)

*Primary Examiner* — Han Yang
*Assistant Examiner* — Jerome Leboeuf
(74) *Attorney, Agent, or Firm* — Trop, Pruner & Hu, P.C.

(57) ABSTRACT

An embodiment provides power (having low voltage, high current, and high current density) to ultra low voltage non-CMOS based devices using a distributed capacitor that is integrated onto the same chip as the non-CMOS devices. For example, an embodiment provides a spin logic gate adjacent dielectric material and first and second plates of a capacitor. The capacitor discharges low voltage/high current to the spin logic gate using a step down switched mode power supply that charges numerous capacitors during one clock cycle (using a switching element configured in a first orientation) and discharges power from the capacitors during the opposite clock cycle (using the switching element configured in a second orientation). The capacitors discharge the current out of plane and to the spin logic devices without having to traverse long power dissipating interconnect paths. Other embodiments are described herein.

10 Claims, 8 Drawing Sheets

(56) References Cited

U.S. PATENT DOCUMENTS

| | | |
|---|---|---|
| 2007/0045759 A1 | 3/2007 | Chung et al. |
| 2007/0218625 A1 | 9/2007 | Ho et al. |
| 2007/0285975 A1* | 12/2007 | Kawahara et al. ............ 365/158 |
| 2008/0054327 A1* | 3/2008 | Johnson ........................ 257/301 |
| 2010/0044089 A1 | 2/2010 | Shibuya et al. |
| 2010/0103726 A1* | 4/2010 | Bae et al. ...................... 365/163 |
| 2010/0127348 A1 | 5/2010 | Quinn |
| 2010/0246250 A1* | 9/2010 | Chen et al. .................... 365/171 |
| 2011/0136317 A1* | 6/2011 | Kang et al. .................... 438/396 |
| 2014/0204696 A1* | 7/2014 | Kato et al. .................... 365/228 |

OTHER PUBLICATIONS

International Search Report and Written Opinion for International Application No. PCT/US2013/032369 mailed Dec. 27, 2013.

* cited by examiner

| | Voltage (V) | Current (A) | Current Per Unit Area | Charge For 4 Hr Battery Life | Required Wh/Kg At 100g | Required Ah/Kg At 100g | Required Source R At 10% Drop | Resistance/ Unit Area (10% Via Fill) | Capacitance At 1 ms Charge Cycle | Capacitance Per Unit Area (Chip=cm$^2$) |
|---|---|---|---|---|---|---|---|---|---|---|
| 1V Supply | 1 | 1 | | $1.4 \times 10^4$C | 40 | 40 | 0.1 Ω | NA | $10^{-3}$F | $10^{-3}$F/cm$_2$ |
| 10 mV Supply | 0.01 | 100 | | $1.4 \times 10^6$C | 40 | 4000 | $10 \times 10^{-6}$Ω | NA | 10F | 10F/cm$_2$ |
| 1V + 10 mV Plane SMPS | 0.01 | 100 | 100A/cm$^2$ | NA | NA | NA | $10 \times 10^{-5}$Ω | 100Ω.cm | 10F | 10F/cm$_2$ |

FIG. 7

INTEGRATED CAPACITOR BASED POWER DISTRIBUTION

This application is a §371 national phase of PCT/US2013/032369 filed Mar. 15, 2013, the content of which is hereby incorporated by reference.

TECHNICAL FIELD

Embodiments of the invention are in the field of semiconductor devices and, in particular, integrated capacitor based power distribution systems.

BACKGROUND

Some magnetic memories, such as a spin transfer torque random access memory (STTRAM), utilize a magnetic tunnel junction (MTJ) for switching and detection of the memory's magnetic state. As shown in FIG. 1, a MTJ consists of ferromagnetic (FM) layers 125, 127 and tunneling barrier 126 (e.g., MgO). The MTJ couples bit line (BL) 105 to selection switch 120 (e.g., transistor), word line (WL) 110, and sense line (SL) 115. Memory 100 is "read" by assessing the change of resistance (e.g., tunneling magnetoresistance (TMR)) for different relative magnetizations of FM layers 125, 127.

STTRAM is just one example of "beyond CMOS" technology (or "non-CMOS based" technology), which relates to devices and processes not entirely implemented with complementary metal-oxide-semiconductor (CMOS) techniques. Beyond CMOS technology may rely on spin polarization (which concerns the degree to which the spin or intrinsic angular momentum of elementary particles is aligned with a given direction) and, more generally, spintronics (a branch of electronics concerning the intrinsic spin of an electron, its associated magnetic moment, and the electron's fundamental electronic charge). Spintronics devices may concern TMR, which uses quantum-mechanical tunneling of electrons through a thin insulator to separate ferromagnetic layers, and STT, where a current of spin polarized electrons may be used to control the magnetization direction of ferromagnetic electrodes.

Beyond CMOS devices include, for example, spintronics devices implemented in memory (e.g., 3 terminal STTRAM), spin logic devices (e.g., logic gates), tunnel field-effect transistors (TFETs), impact ionization MOS (IMOS) devices, nano-electro-mechanical switches (NEMS), negative common gate FETs, resonant tunneling diodes (RTD), single electron transistors (SET), spin FETs, nanomagnet logic (NML), domain wall logic, domain wall memory, and the like.

BRIEF DESCRIPTION OF THE DRAWINGS

Features and advantages of embodiments of the present invention will become apparent from the appended claims, the following detailed description of one or more example embodiments, and the corresponding figures, in which:

FIG. 7 includes a table concerning power supply operating characteristics for non-CMOS based technologies.

DETAILED DESCRIPTION

Figure 1:
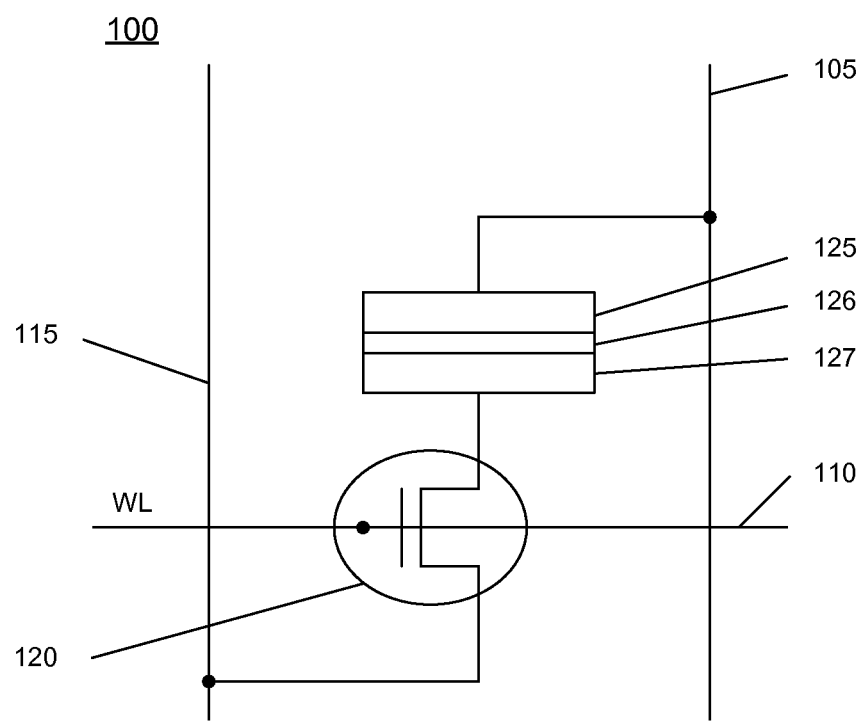
FIG. 1 depicts a conventional magnetic memory cell.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment. Terms such as "upper" and "lower" "above" and "below" may be understood by reference to the illustrated X-Z coordinates, and terms such as "adjacent" may be understood by reference to X-Y coordinates or to non-Z coordinates.

Many beyond CMOS devices operate at ultra-low voltages (e.g., 0.1 V for TFETS, 10 mV-100 mV for domain wall memory, and 1 mV-10 mV for spin logic devices). For modest power requirements (e.g., 1 W per chip), the high current requirements (e.g., 10 A-100 A) corresponding to the low ultra-low voltages creates a power distribution problem, mitigating the advantages gained with beyond CMOS devices. For example, electrochemical cells, that directly produce 10 mV, do not have the capacity to supply 100 A current and do not supply sufficient charge over a typically desired time of operation (e.g., 2-4 hours) due to electron density limitations (i.e., the required charge exceeds the number of free electrons in a battery of a reasonable size) (see second row of FIG. 7). As another example, step down converters for converting 1 V to 10 mV exist but are not integrated on the same chip/substrate as the beyond CMOS devices (See first row of FIG. 7) and cannot supply sufficient charge due to the same aforementioned considerations. Moreover, the off-chip converter suffers power losses in the distribution network delivering power from the converter to target devices (i.e., power must traverse resistive interconnects and suffers power loss as a result). FIG. 7 provides a summary of power supply requirements at, for example, 10 mV with a 4 hour battery life at a thermal design point (TDP) of 1 W. More specifically, a power supply converting a 1V, 1 A supply to a 10 mV (i.e., ultra low power), 100 A supply (i.e., moving from first row of FIG. 7 to second row of FIG. 7) must satisfy corresponding capacitance ($1.4 \times 10^4$ C), and density (40 A-hour/kg at 100 g) requirements. This can be difficult to accomplish with a system that integrates a power supply on the same chip (i.e., a monolithic substrate) as a beyond CMOS logic gate.

However, an embodiment provides power (having low voltage, high current, and high current density) to ultra-low-voltage non-CMOS based devices using a distributed capacitor that is integrated onto the same chip as the non-CMOS devices. For example, an embodiment provides a spin logic gate adjacent to a dielectric material and first and second plates of a capacitor. The capacitor discharges low voltage/high current to the spin logic gate using a step down switched mode power supply that charges numerous capacitors during one clock cycle (using a switching element configured in a first orientation) and discharges power from the capacitors during the opposite clock cycle (using the switching element configured in a second orientation). The capacitors discharge the current out of plane and to the spin logic devices without having to traverse long power dissipating interconnect paths. Other embodiments are described herein.

For example, an embodiment uses a switch mode power supply (SMPS) to obtain a very low supply voltage with high current delivery. The embodiment satisfies the current density, resistivity, and capacitance demands of the materials and devices available (e.g., see third row of FIG. 7). For example, an embodiment provides ample current density (e.g., 100 A/cm$^2$), while still providing a low voltage supply (e.g., less than 125 mV), by implementing a high capacitance layer integrated into a CMOS stack.

Figure 2:
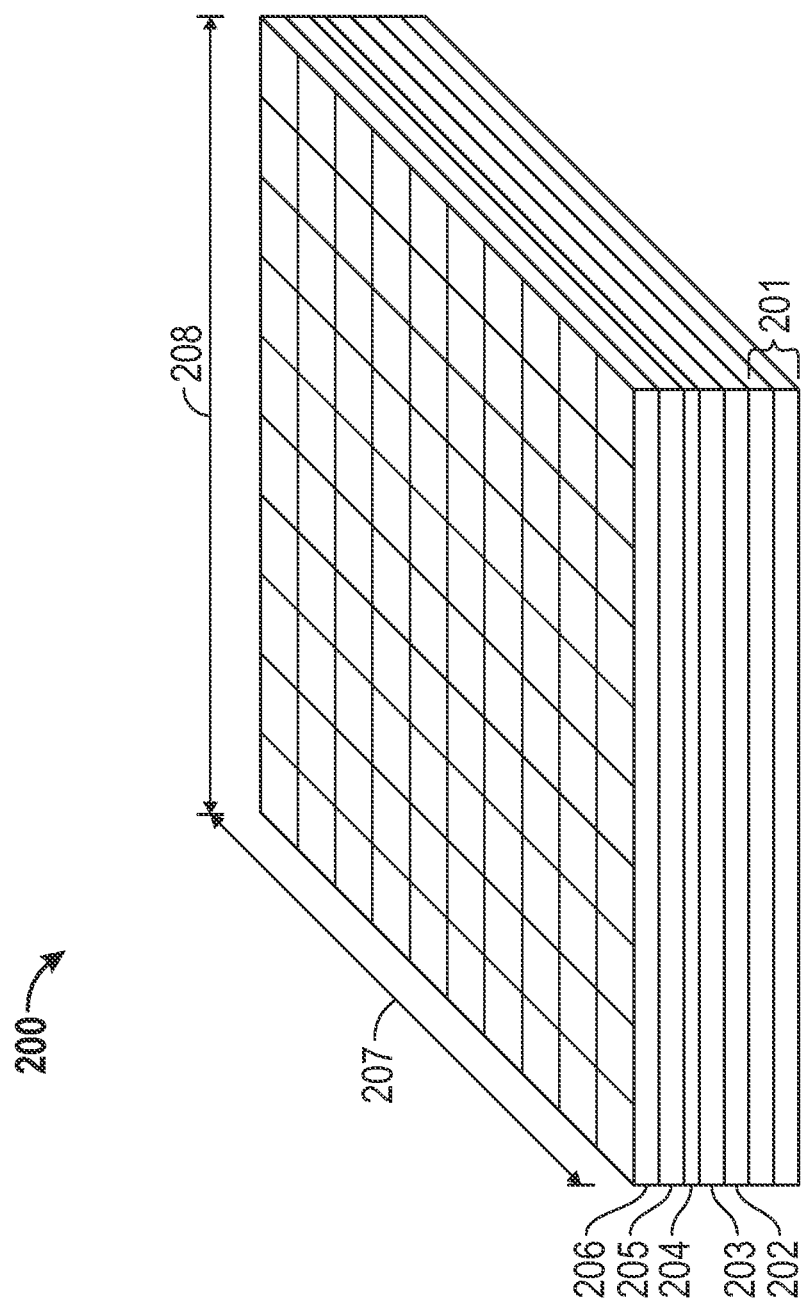
FIG. 2 depicts a power plane in an embodiment of the invention.

FIG. 2 depicts a high capacitance layer (i.e., power plane) in an embodiment of the invention. Device portion 200 includes power plane 206. Power plane 206 provides capacitance whereby current is delivered "out of plane" (vertically to a horizontally disposed plane such as plane 206) to avoid the high resistance (e.g., series resistance) in patterned wires that would otherwise be needed to route power from, for example, on off chip power supply to a device (e.g., spin logic gate) located on the chip. Power plane 206 may include super capacitor materials comprising, for example, one or more high K materials such as Hafnium Oxide ($HfO_2$), Ruthenium Oxide (RuO), Molybdenum Oxide ($MoO_3$), $LiMn_2O_4$ activated carbon, complex metal oxides, and the like disposed between plates of the capacitors formed in layer 206 (which will be further discussed below in regard to FIGS. 3 and 4).

Power plane 206 is disposed "on" or "over" dielectric layer 205 (e.g., oxide), beyond CMOS device layer 204 (e.g., layer including spin logic devices, magnetic memories such as STTRAM, and the like), dielectric layer 203, ground or sink plane 202, and CMOS layers 201 (e.g., used for creating CMOS transistors). In one embodiment plane 206 includes length 207 of 1 cm and width 208 of 1 cm yielding a 100 mm$^2$ plane having 100 capacitor portions therein, which are explained further below.

Notably, while FIG. 2 shows layer 206 above layer 204 other orientations are possible with, for example, layer 204 being above layer 206 or beside layer 206 (i.e., rotating system 200 180 or 90 degrees respectively).

Figure 3:
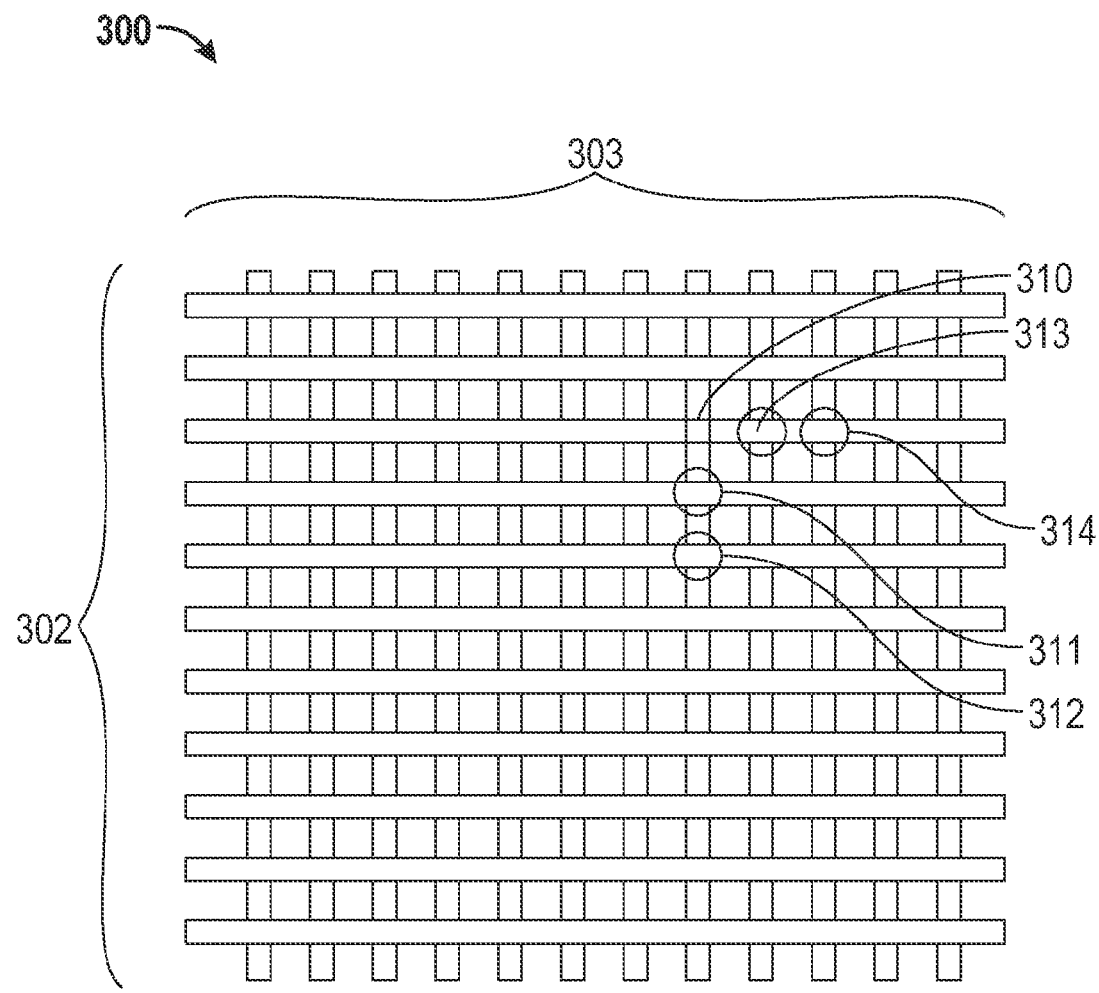
FIG. 3 depicts an array of ground lines and power supply lines in an embodiment of the invention.

FIG. 3 depicts an array of ground lines (302) and power supply lines (303) in an embodiment of the invention. More specifically, the diagram shows a box at area 310. This is where 1 of the 100 capacitors exists (i.e., as shown in FIG. 2 plane 206 may include 100 capacitors in one embodiment of the invention). The ground line at junction/capacitor 310 corresponds to layer 420 of FIG. 4 and power supply line at junction/capacitor 310 corresponds to layer 403 of FIG. 4. An insulation layer (layer 421 of FIG. 4) is located between the ground and power supply lines (and is not visible in FIG. 3). The capacitor formed is, in one embodiment, a metal-insulator-metal (MiM) super-capacitor with a high-k material (not shown) between the supply and ground planes. The supply and ground plane lines intersect (but do not directly contact one another) to allow for via formation (e.g., "dropping") and greater metal layer fill factor. Thus, MiM capacitors are formed at intersections 310, 311, 312, 313, 314 (and many other intersections not labeled for brevity and clarity purposes).

Figure 4:
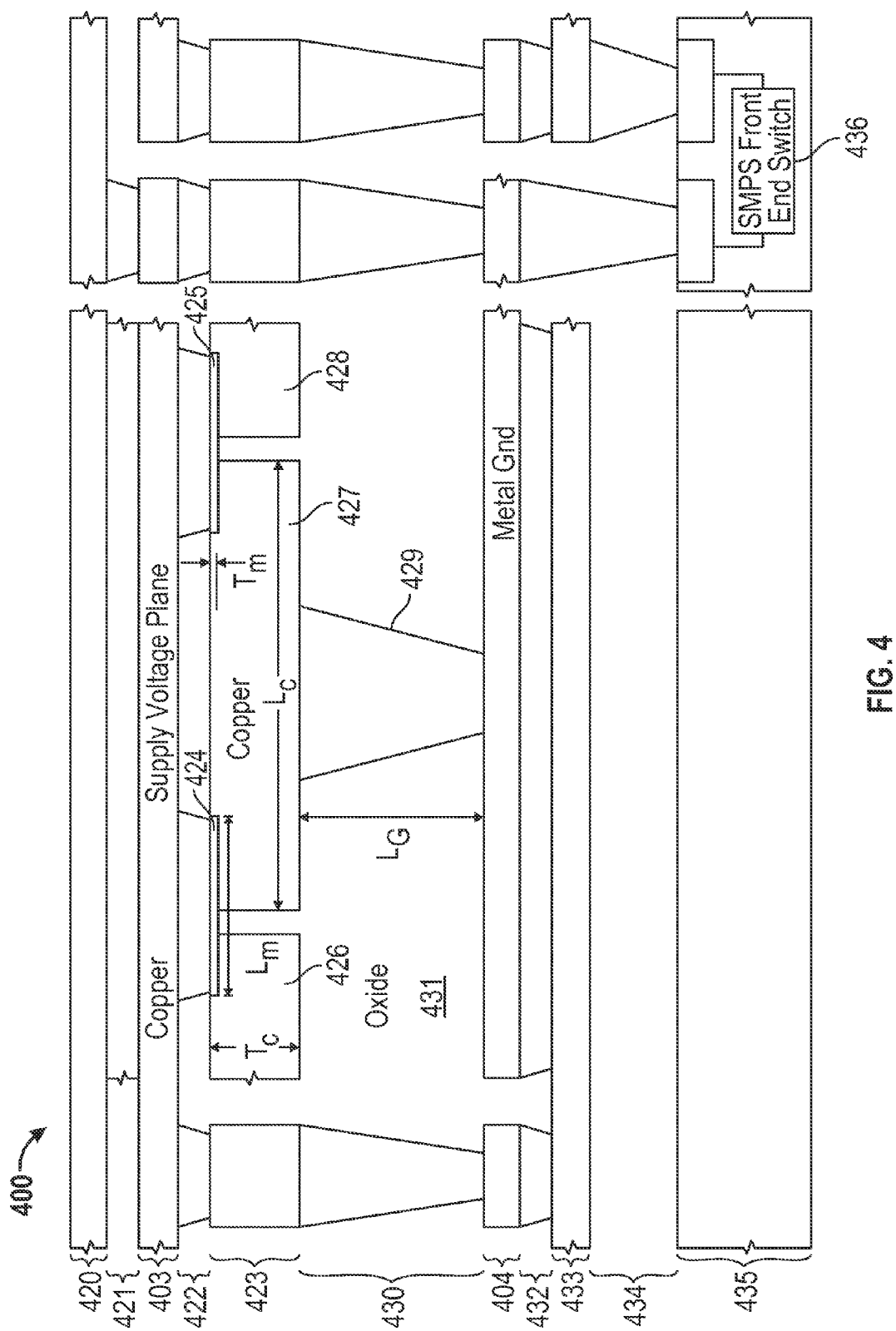
FIG. 4 depicts a spin logic device integrated with a capacitor based power distribution system in an embodiment of the invention.

FIG. 4 depicts a spin logic device (e.g., a spin logic gate based inverter) integrated with a capacitor based power distribution system in an embodiment of the invention. More specifically, system 400 may be included at any of intersections 310, 311, 312, 313, 314. In other words, FIG. 2 provides a 1 cm×1 cm portion of a chip. That portion provides 100 individual capacitors. Each capacitor has 2 plates (top plate separated from a bottom plate by an insulation layer), which are isolated from the plates of the other 99 capacitors. As used herein, a "plate" is not necessarily a metal plate but may be film or layer or portion thereof constituting a terminal or node of a capacitor. Each capacitor may in turn supply power to thousands of beyond CMOS logic and/or memory devices. FIG. 4 shows one small portion of 1 of the 100 capacitors. This small portion supplies power to one device which, in this example, happens to be a spin logic inverter. Of course other embodiments are not limited to 100 capacitors per chip or section of chip and may include more or less than that amount.

More specifically, system 400 includes top plate/layer 420 for a capacitor, insulation layer 421 for the capacitor, and bottom plate/layer 403 for the capacitor. Thus, layers 420, 421, 403 create a capacitor. The capacitor discharges current to magnets 424, 425 by way of vias located in layer 422. Doing so generates spin polarized current in copper portions 426, 427, 428 of layer 423 (which are not limited to copper in other embodiments). A disproportionate amount of spin polarized current from magnet 424 (opposed to spin polarized current from magnet 425) may induce an inversion of a signal across magnet 425 and copper portions 427, 428 (thereby serving the role of an inverter). Current may pass from copper portion 427 to ground plane 404. Ground plane 404 may be formed on general build up layers symbolized by layer 404 (and 432), which couples to a symbolized metal layer such as layer 433. Oxide 431 is generally located in layers such as layers 422, 430, 434 and between copper sections 426, 427, 428. Layer 404 may couple to CMOS layer 435/substrate, which includes switching element 436 (formed of CMOS-based transistors in the substrate). Switching element 436, which is discussed further below with regard to FIG. 6, charges and discharges the MiM capacitor (formed by layers 420, 421, 403). Layer 435 may include a substrate or be formed on a substrate.

In an embodiment, the substrate is a bulk semiconductive material as part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

While embodiment 400 includes a spin logic inverter, other embodiments are not limited to inverters, spin logic gates/circuits, or even spintronic memory. However, an inverter is used for illustrative purposes.

Embodiment 400 may operate at 1 mV, 10 mV, 100 mV, or more and effectively integrates a power supply with the aforementioned spin logic device (which could just as easily be STTRAM or any other beyond CMOS device) onto a single chip (e.g., monolithic substrate). The integrated power supply comprises a capacitor having a first plate (plane 420), a dielectric (dielectric 421), and a second plate (plane 403). Vias, such as those coupling layer 403 to layer 433 are for illustrative purposes to show how layers interconnect. Such vias may be excluded in various embodiments of the invention. Furthermore, illustrative "broken lines" are shown in various portions of FIG. 4 to better illustrate the concept that this figure is just a portion of system taken from the perspective of a single device (inverter) and that planes such as plane 403 may continue on beyond the scope of the page upon which FIG. 4 is displayed.

In an embodiment magnets 424, 425 may be ferromagnets having a length (Lm=50 nm), width (20 nm), and height/thickness (Tm=3 nm). Copper length 427 may have a length (Lc=100-300 nm), width (20 nm), and height/thickness (Tm=3-10 nm). Other embodiments are not so limited.

As indicated above with regard to FIG. 2, in one embodiment plane 206 includes length 207 of 1 cm and width 208 of 1 cm yielding a 100 mm$^2$ plane having 100 1 mm×1 mm capacitor portions. This array of capacitors, which may be MiM capacitors, may be charged in a single time interval (e.g., a clock cycle). For example, some or all of the capacitors may be charged in series with one another or in parallel with one another.

An embodiment, having a 1 W chip subdivided into 100 parts for power distribution may possess the low voltage, series resistance, resistivity, capacitance, and current density characteristics (wherein current density limits are imposed by, for example, via 429 and/or other vias) seen in FIG. 7. More specifically, FIG. 7 illustrates in the first row use of a 1 V supply, which would need to couple to an off chip step down converter to produce the proper low voltage requirements for the beyond CMOS devices. The second row addresses a 10 mV supply, such as a battery. However, such a battery would likely be unable to produce such a high currently density and overall electric charge for the duration of operation (4,000 A-hour/kg at 100 g). The third row corresponds to an embodiment (e.g., FIG. 4) whereby a 1 volt supply is down-converted to a 10 mV supply via the distributed capacitor. Doing so provides an acceptable current density of 100 A/cm$^2$ and obviates the need for such high densities such as 4,000 A-hour/kg at 100 g or excessive charge of $1.4 \times 10^6$ C.

FIG. 5a depicts a charge mode configuration in a SMPS and FIG. 5b depicts a discharge mode configuration in the power supply in an embodiment of the invention. Elements 540, 541, 542 symbolize capacitance (e.g., parasitic capacitance) between layers within the chip. Capacitors 510, 511, 512, however, correspond to capacitors 310, 311, 312 of FIG. 3. Furthermore, any of capacitors 510, 511, 512 may correspond to the capacitor of FIG. 4 comprised of layers 420, 421, 403. As shown in configuration 500 of FIG. 5a, during the SMPS charging mode capacitors 510, 511, 512 are charged in series. As shown in configuration 500 of FIG. 5b, switching mechanisms (circuits) may be configured to convert the SMPS from a series to a parallel connection when switching from charge mode to discharge mode, whereby capacitors 510, 511, 512 are discharged in parallel. The series configured charge mode provides for large voltage division and current multiplication. For example, a 1 V power supply applied to charge configuration 500 may be divided down over 100 capacitors to provide 10 mV per capacitor. In place of the charging current of, for example, 1 A, each of the capacitors supplies a discharge current of 1 A to create the total current of 100 A over the chip. In addition, the parallel configured discharge mode enables ultra-low series resistance as power need not traverse extended paths and instead deploys out of plane directly to a device, such as the spin logic gate of FIG. 4.

Figure 5:
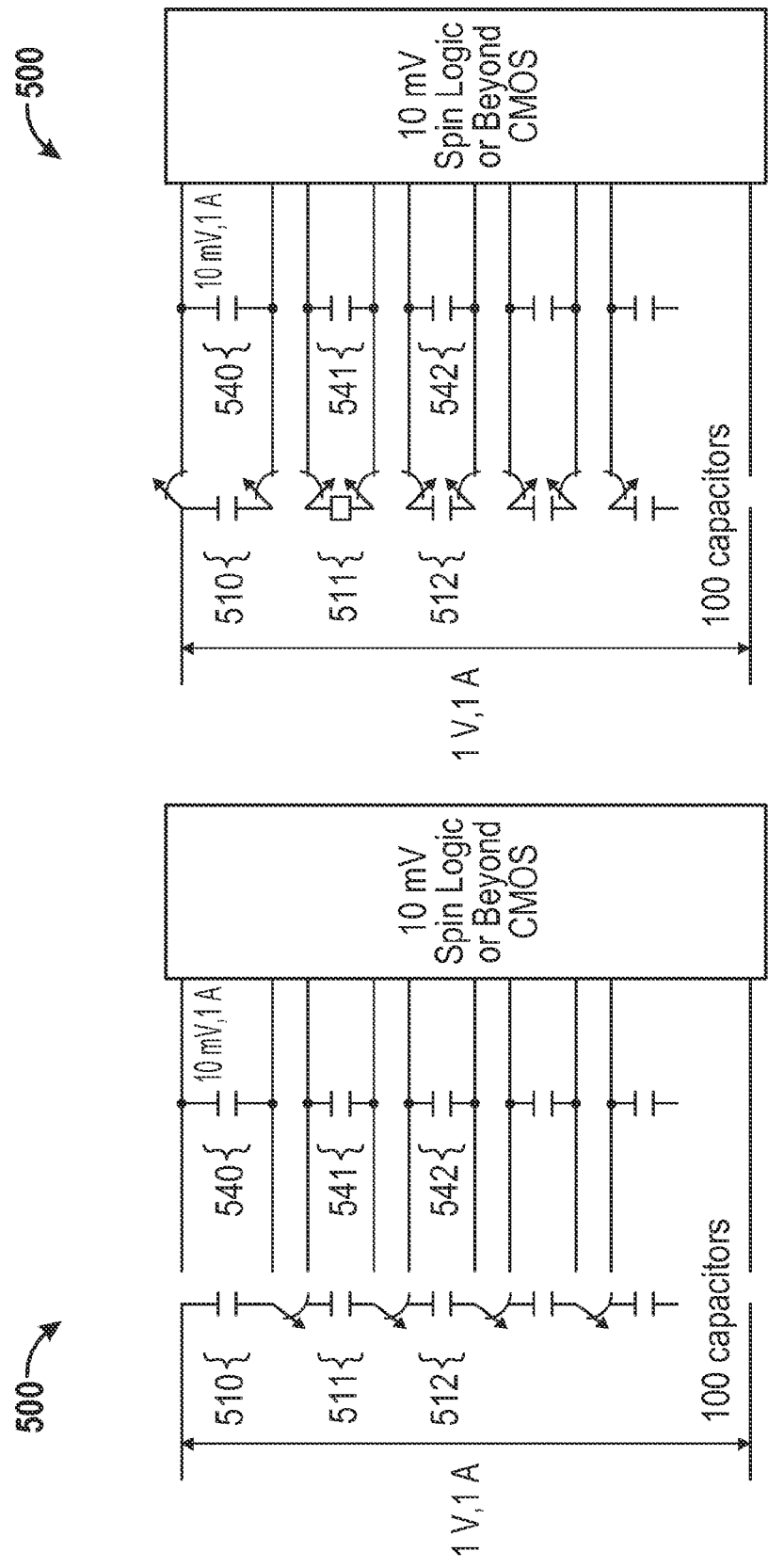
FIG. 5a depicts charge mode configuration in a switching mode power supply and FIG. 5b depicts discharge mode configuration in a switching mode power supply in an embodiment of the invention.

In an embodiment the SMPS includes a charging cycle at, for example, 1 KHz-10 MHz where a bank of capacitors (e.g., the 100 capacitors of FIG. 2) is connected in series to charge to 1 V (FIG. 5a). In an embodiment the SMPS includes a discharge cycle at 1 KHz-10 MHz where the capacitors (each at 10 mV) are discharged in parallel into the device layer (e.g., layer 423 of FIG. 4) (FIG. 5 B). In one embodiment in order to ensure an uninterrupted power supply, a part of the on-chip capacitors (e.g., 310) can be in charge mode, while a part of the capacitors (e.g., 314) can be in discharge mode. Then the SMPS is switched, and charge and discharge modes are reversed.

Thus, FIGS. 5a and 5b illustrate how an entire SMPS is located on a chip along with spin logic devices, spintronic memory, and the like. While the SMPS may cooperate with a battery located off chip, the SMPS itself is located on the chip.

Figure 6:
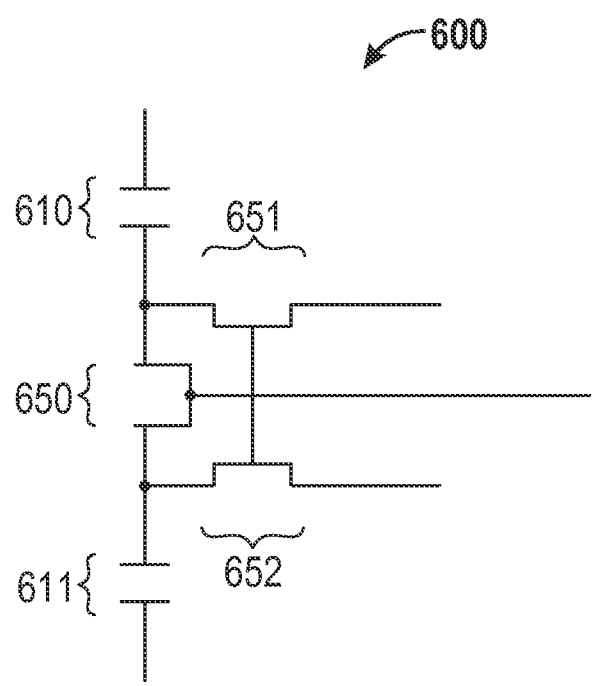
FIG. 6 includes a switching element in a switching mode power supply in an embodiment of the invention.

FIG. 6 includes a switching element in a switching mode power supply in an embodiment of the invention. Configuration 600 includes capacitors 610, 611 (corresponding to capacitors 310, 311 of FIG. 3) and a switching element (corresponding to element 436 of FIG. 4) comprising switching devices (e.g., transistors) 650, 651, 652. The switching element is part of a SMPS embodiment for converting a 1V, 1 A supply to a 10 mV, 100 A supply (i.e., moving from the first row of FIG. 7 to the third row of FIG. 7), which meets the resistivity and capacitance requirements of FIG. 7 (i.e., those listed in the third row). Transistor 650 is operative during a clock phase and transistors 651, 652 are operative in an opposite SMPS clock phase (e.g., transistor 650 may be a pFET and transistors 651, 652 may be nFETs).

An embodiment includes the following capacitance per unit area characteristics to enable a low resistance, low power supply that is operative with beyond CMOS devices (e.g., spin logic devices).

In one embodiment the total charge (Q) required for a chip having an area A=1 mm$^2$ with a $P_d$=1 W/cm$^2$ power requirement at the spin logic voltage $V_{SL}$=0.01 V and SMPS switching frequency is 10 MHz is:

$$Q = \frac{P_d A T_{smps}}{V_{SL}} = 10^{-7} C,$$

Where $T_{smps}$ is the period (inverse frequency) of SMPS switching.

The effective capacitance per unit area at a voltage 0.01 V is thus:

$$C_d = \frac{P_d T_{smps}}{V_{SL}^2} = 10^{-3} F/cm^2.$$

The required effective capacitance value corresponds to normal capacitance with 10 nm dielectric thickness (i.e., regular dielectric material and not super capacitance high-k materials such as $HfO_2$, $RuO$, $MoO_3$, and $LiMn_2O_4$ activated carbon). An embodiment has a constraint on the dielectric constant, at a dielectric thickness d=10 nm, of:

$$\varepsilon > \frac{C_d d}{\varepsilon_0} = 1.1$$

This is one option for a dielectric constant. A higher dielectric constant will help relax the requirement for the thickness of the layers, requirement on the area occupied by capacitors, or increase the performance of the power plane.

An embodiment includes a fill factor for the power plane at a given dielectric constant (e.g., silica at 3.9, $HfO_2$ at 25), where the fill factor of the power plane is the total area of the power plane used for the MiM capacitors divided by the chip area. Fill factor for the power plane is given by:

$$F = \frac{C_d d}{\varepsilon \varepsilon_0}$$

For $SiO_2$ the value is $F_{SiO2}$=28.97% and for $HfO_2$ the value is $F_{HfO2}$=4.52%. Hence, the fill factors of the supply plane will leave sufficient space for reuse of the metal layer for regular routing or for via dropping.

An embodiment includes a series resistance whereby series resistance seen by the logic device layer is the source resistance of the SMPS at the output. At a fill factor of 10% the series resistance of the via layer per unit chip area is (via resistivity is assumed 10 times copper resistivity):

$$R_s = \frac{\rho L}{FA} \sim 1.6 \times 10^{-12} \Omega/cm^2,$$

Where L is length of the via

The effective series resistance voltage drop over the vias is 0.16 nV (which is small compared to the 10 mV supply). At a voltage drop of $V_{drop}$=1 mV, the required total conductance of the switches per unit chip area:

$$G_{total} = 3 \frac{P_d}{V_{SL} V_{drop}} = 3 \times 10^5 / (\Omega \cdot cm^2)$$

The power switching transistors (e.g., transistors 650, 651, 652) are operated at a low resistance region, below the supply voltage $V_{dd}$, where the resistance per unit length of the transistors is less than:

$$G_{STV} = 5 \frac{I_{dsat}}{V_{dd}} = 1.4 \times 10^4 / (\Omega m),$$

Where $I_{dsat}$ is taken from the 2011 edition of the International Technology Roadmap for Semiconductors available at www*itrs.net/Links/2011ITRS/Home2011*htm.

In an embodiment the total conductance of $G_{total}$ requires a gate length per unit area of the chip to be:

$$L_{gtotal} = \frac{G_{total}}{G_{STV}} = \frac{3 P_d V_{ds}}{5 V_{SL} V_{drop} I_{sat}} = 21 \text{ m/cm}^2$$

An embodiment may use a total power transistor gate length of 21 meters to power a 100 $mm^2$ chip at 1 $W/cm^2$ power budget.

In an embodiment the fraction of area of the power transistors (e.g., transistors 650, 651, 652) is:

$$F_{Ptran} = 4 F L_{gtotal} = \frac{12 F P_d V_{ds}}{5 V_{SL} V_{drop} I_{sat}} = 2.52\%$$

Hence, the area overhead for power gating and conversion is less than 3%.

In an embodiment power conversion losses in the SMPS (output delivered power of the SMPS as a fraction of the input power) is as follows:

$$P_{loss} = I_{on} V_{drop} + \frac{C_{Gtotal} V_g^2}{T_{smps}}$$

Or in other words:

$$P_{loss} = \frac{P_d A}{V_{SL}} V_{drop} + \frac{3 P_d V_{ds} V_g^2}{5 V_{SL} V_{drop} I_{sat} T_{smps}} = 0.141 \text{ W/cm}^2$$

and power efficiency of the SMPS is given by:

$$\eta_{SMPS} = 1 - \frac{P_{loss}}{P_d} = \frac{A}{V_{SL}} V_{drop} + \frac{3 V_{ds} V_g^2}{5 V_{SL} V_{drop} I_{sat} T_{smps}} = 85.88\%$$

Thus, an embodiment has a power conversion efficiency of 85.88% with an aerial overhead of 2.5% (for a high-k dielectric), on state drop of 1 mV, area fill factor of the power plane of 25%, and current density of 400 $A/cm^2$. The series resistance drop is less than 1 nV, thereby avoiding the interconnect losses as outlined in a traditional voltage network.

Figure 8:
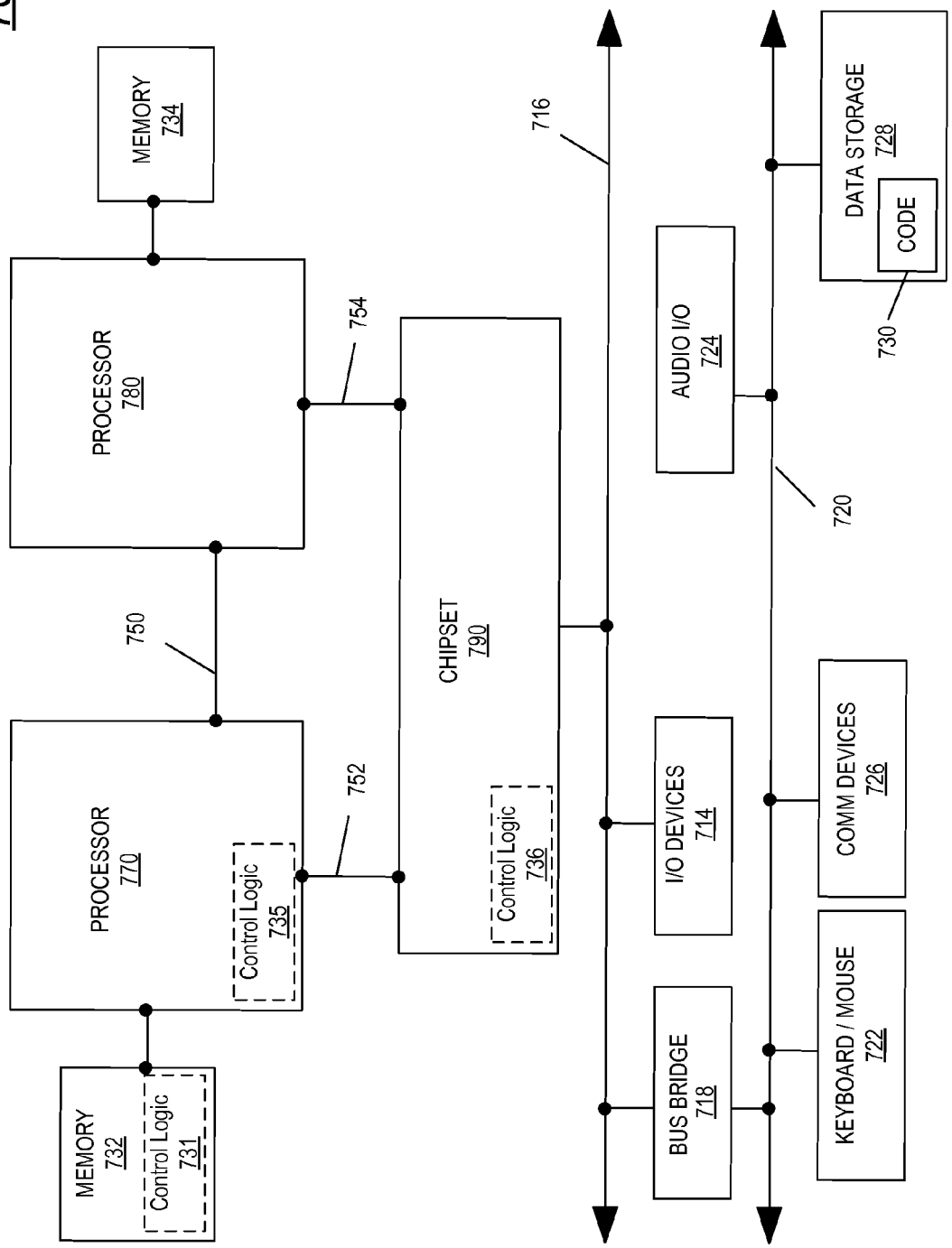
FIG. 8 depicts a system for use with embodiments of the invention.

Embodiments may be used in many different types of systems. For example, in one embodiment a communication device (e.g., cell phone, Smartphone, netbook, notebook, personal computer, watch, camera, and Ultrabook®) can be arranged to include various embodiments described herein. Referring now to FIG. 8, shown is a block diagram of a system in accordance with an embodiment of the present invention. Multiprocessor system 700 is a point-to-point interconnect system, and includes a first processor 770 and a second processor 780 coupled via a point-to-point interconnect 750. Each of processors 770 and 780 may be multicore processors. First processor 770 may include a memory controller hub (MCH) and point-to-point (P-P) interfaces. First processor 770 may include spin logic gates power via a distributed capacitor. Similarly, second processor 780 may include a MCH and P-P interfaces. The MCHs may couple the processors to respective memories, namely memory 732 and memory 734, which may be portions of main memory (e.g., a dynamic random access memory (DRAM)) locally attached to the respective processors. First processor 770 and second processor 780 may be coupled to a chipset 790 via P-P interconnects, respectively. Chipset 790 may include P-P interfaces. Furthermore, chipset 790 may be coupled to a first bus 716 via an interface. Various input/output (I/O) devices 714 may be coupled to first bus 716, along with a bus bridge 718, which couples first bus 716 to a second bus 720. Various devices may be coupled to second bus 720 including, for example, a keyboard/mouse 722, communication devices 726, and data storage unit 728 such as a disk drive or other mass storage device, which may include code 730, in one embodiment. Code may be included in one or more memories including memory 728, 732, 734, memory coupled to system 700 via a network, and the like. Further, an audio I/O 724 may be coupled to second bus 720.

As a further example, at least one machine readable medium comprises a plurality of instructions that in response to being executed on a computing device, cause the computing device to carry out any of the methods described herein. An apparatus for processing instructions may be configured to perform the method of any of the methods described herein. And an apparatus may further include means for performing any of the methods described herein.

Embodiments may be implemented in code and may be stored on a machine readable storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following examples pertain to further embodiments.

Example 1 includes an apparatus comprising: a supply voltage plane that includes an array of supply voltage lines; a ground plane that includes an array of ground lines; an array of capacitors formed from the arrays of supply voltage lines and ground lines; a first capacitor, formed at a first intersection between a first supply voltage line, included in the array of supply voltage lines, and a first ground line, included in the array of ground lines; wherein the capacitor comprises a first plate that includes a portion of the first supply voltage line, a second plate that includes a portion of a first ground line, and a first dielectric formed between the first and second plates; a device, to electrically couple to the capacitor, comprising at least one of a tunnel field-effect transistor, spin transfer torque (STT) memory, and a spin logic device; and a switching element coupled to the capacitor and included within a switching mode power supply; wherein (a) the array of capacitors, which includes the first capacitor, the device, and the switching element are all formed on a single monolithic substrate; and (b) the switching element discharges the capacitor to drive current between the first and second plates and then to the device.

In Example 2, the subject matter of Example 1 can optionally include a second capacitor, formed at a second intersection between a second supply voltage line, included in the array of supply voltage lines, and a second ground line, included in the array of ground lines; wherein the second capacitor comprises an additional first plate that includes a portion of the second supply voltage line, an additional second plate that includes a portion of a second ground line, and a second dielectric formed between the additional first and second plates; wherein the power supply charges the first and second capacitors in series with one another during a charging mode and discharges the first and second capacitors in parallel with one another during a discharge mode.

In Example 3, the subject matter of Examples 1-2 can optionally include the array of capacitors are metal-insulator-metal (MiM) capacitors.

In Example 4, the subject matter of Examples 1-3 can optionally include wherein: the switching element includes first, second, and third switching devices; the power supply charges the first capacitor during a first clock phase and discharges the first capacitor during a second clock phase that is opposite the first clock phase; and the first switching device is active during the first clock phase and the second and third switching devices are active during the second clock phase.

In Example 5, the subject matter of Examples 1-4 can optionally include wherein the power supply discharges the first capacitor orthogonally to the supply voltage plane to drive current between the first and second plates and then to the device.

In Example 6, the subject matter of Examples 1-5 can optionally include wherein the power supply is a step down converter that steps supply voltage down from more than 1 V to less than 15 mV and supplies current greater than 90 A with a current density greater than 380 A/cm2.

In Example 7, the subject matter of Examples 1-6 can optionally include an interconnect coupling the device to one of the first and second plates, wherein an axis orthogonal to the second plate intersects the first and second plates and the device.

In Example 8, the subject matter of Examples 1-7 can optionally include wherein the first dielectric includes at least one of Hafnium Oxide, Ruthenium Oxide, Molybdenum Oxide, and LiMn2O4 activated carbon.

In Example 9, the subject matter of Examples 1-8 can optionally include wherein the entire power supply is included on the substrate and is to couple to a battery located off the substrate.

Example 10 includes an apparatus comprising: a supply voltage plane that includes a plurality of supply voltage lines; a ground plane that includes a plurality of ground lines; a plurality of capacitors each having a first terminal formed from one of the supply voltage lines and a second terminal formed from one of the ground lines; and a non-CMOS based device to electrically couple to a capacitor included in the plurality of capacitors; wherein the capacitors and the device are both formed on a single monolithic substrate.

In Example 11, the subject matter of Example 10 can optionally include a switching element coupled to the capacitor.

In Example 12, the subject matter of Examples 10-11 can optionally include wherein the switching element discharges the capacitor to drive current between the first and second terminals and through the device.

In Example 13, the subject matter of Examples 10-12 can optionally include wherein the switching element discharges the capacitor to drive current from a power supply to the capacitor and between the first and second terminals.

In Example 14, the subject matter of Examples 10-13 can optionally include wherein the device is at least one of a tunnel field-effect transistor, spin transfer torque (STT) memory, and a spin logic device.

Example 15 includes an apparatus comprising: a capacitor including a first plate that includes a portion of a voltage line, a second plate that includes a portion of a ground line, and a dielectric formed between the first and second plates; a spintronic device coupled to the capacitor; and a switch element coupled to the capacitor and included in a switch mode power supply; wherein the capacitor, the device, and the switch element are all formed on a single monolithic substrate; and (b) the switch element discharges the capacitor to drive current between the first and second plates and then to the device.

In Example 16, the subject matter of Example 15 can optionally include an additional capacitor including an additional first plate that includes a portion of an additional voltage line and an additional second plate that includes a portion of an additional ground line, and an additional dielectric formed between the first and second plates; wherein the power supply charges the first and second capacitors in series with one another and discharges the first and second capacitors in parallel with one another.

In Example 17, the subject matter of Examples 15-16 can optionally include the switch element includes first and second transistors: the power supply charges the capacitor during a first clock phase and discharges the capacitor during a second clock phase; and the switch device is active during the first clock phase and the second switch device is active during the second clock phase.

In Example 18, the subject matter of Examples 15-17 can optionally include wherein the power supply discharges the capacitor orthogonally to a supply voltage plane that includes the voltage line.

In Example 19, the subject matter of Examples 15-18 can optionally include wherein the power supply is a step down converter that steps supply voltage down from more than 1 V to less than 15 mV and supplies current greater than 90 A with a current density greater than 380 A/cm2.

In Example 20, the subject matter of Examples 15-19 can optionally include wherein an axis orthogonal to the second plate intersects the first and second plates and the device.

In Example 21, the subject matter of Examples 15-20 can optionally include wherein the dielectric includes at least one of Hafnium Oxide, Ruthenium Oxide, Molybdenum Oxide, and LiMn2O4 activated carbon.

In Example 22, the subject matter of Examples 15-21 can optionally include wherein the entire power supply is included on the substrate and is to couple to a battery located off the substrate.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a supply voltage plane that includes an array of supply voltage lines;
   a ground plane that includes an array of ground lines;
   an array of capacitors formed from the arrays of supply voltage lines and ground lines;
   a first capacitor, formed at a first intersection between a first supply voltage line, included in the array of supply voltage lines, and a first ground line, included in the array of ground lines; wherein the capacitor comprises a first plate that includes a portion of the first supply voltage line, a second plate that includes a portion of the first ground line, and a first dielectric formed between the first and second plates;
   a device, to electrically couple to the capacitor, comprising at least one of a tunnel field-effect transistor, spin transfer torque (STT) memory, and a spin logic device; and
   a switching element coupled to the capacitor and included within a switching mode power supply;
   wherein (a) the array of capacitors, which includes the first capacitor, the device, and the switching element are all formed on a single monolithic substrate; and (b) the switching element discharges the capacitor to drive current between the first and second plates and then to the device.

2. The apparatus of claim 1 comprising:
   a second capacitor, formed at a second intersection between a second supply voltage line, included in the array of supply voltage lines, and a second ground line, included in the array of ground lines; wherein the second capacitor comprises an additional first plate that includes a portion of the second supply voltage line, an additional second plate that includes a portion of the second ground line, and a second dielectric formed between the additional first and second plates;
   wherein the power supply charges the first and second capacitors in series with one another during a charging mode and discharges the first and second capacitors in parallel with one another during a discharge mode.

3. The apparatus of claim 1, wherein the array of capacitors are metal-insulator-metal (MiM) capacitors.

4. The apparatus of claim 1, wherein:
   the switching element includes first, second, and third switching devices;
   the power supply charges the first capacitor during a first clock phase and discharges the first capacitor during a second clock phase that is opposite the first clock phase; and
   the first switching device is active during the first clock phase and the second and third switching devices are active during the second clock phase.

5. The apparatus of claim 1, wherein the power supply discharges the first capacitor orthogonally to the supply voltage plane to drive current between the first and second plates and then to the device.

6. The apparatus of claim 5, wherein the power supply is a step down converter that steps supply voltage down from more than 1 V to less than 15 mV and supplies current greater than 90 A with a current density greater than 380 A/cm$^2$.

7. The apparatus of claim 1 comprising an interconnect coupling the device to one of the first and second plates, wherein an axis orthogonal to the second plate intersects the first and second plates and the device.

8. The apparatus of claim 7 wherein (a) the device is a spin logic inverter comprising a magnetic layer portion directly contacting a metal layer portion, and (b) the axis intersects the magnetic and metal layer portions.

9. The apparatus of claim 1 wherein the first dielectric includes at least one of Hafnium Oxide, Ruthenium Oxide, Molybdenum Oxide, and LiMn$_2$O$_4$ activated carbon.

10. The apparatus of claim 1 wherein the entire power supply is included on the substrate and is to couple to a battery located off the substrate.

* * * * *